(12) United States Patent
Li

(10) Patent No.: US 11,063,098 B2
(45) Date of Patent: Jul. 13, 2021

(54) METHOD FOR FABRICATING DISPLAY PANEL HAVING CARBON QUANTUM DOT LAYER

(71) Applicant: Shenzhen China STAR OPTOELECTRONICS SEMICONDUCTOR DISPLAY TECHNOLOGY CO., LTD., Guangdong (CN)

(72) Inventor: Xianglong Li, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 5 days.

(21) Appl. No.: 16/618,954

(22) PCT Filed: Nov. 6, 2019

(86) PCT No.: PCT/CN2019/115855
§ 371 (c)(1),
(2) Date: Dec. 3, 2019

(87) PCT Pub. No.: WO2021/042496
PCT Pub. Date: Mar. 11, 2021

(65) Prior Publication Data
US 2021/0066413 A1 Mar. 4, 2021

(30) Foreign Application Priority Data
Sep. 4, 2019 (CN) .......................... 201910832080.X

(51) Int. Cl.
*H01L 29/08* (2006.01)
*H01L 27/32* (2006.01)
(Continued)

(52) U.S. Cl.
CPC ........ *H01L 27/3246* (2013.01); *H01L 51/502* (2013.01); *H01L 51/5056* (2013.01);
(Continued)

(58) Field of Classification Search
CPC ...... H01L 51/5253; H01L 51/56; H01L 29/08
See application file for complete search history.

(56) References Cited

U.S. PATENT DOCUMENTS 7,365,488 B2 * 4/2008 Lee ..................... H01L 51/5218
313/506
2014/0353613 A1 * 12/2014 Cheon ................. H01L 51/0008
257/40
(Continued)

FOREIGN PATENT DOCUMENTS

| CN | 103915553 A | 7/2014 |
|---|---|---|
| CN | 104409650 A | 3/2015 |

(Continued)

*Primary Examiner* — Caleb E Henry

(57) ABSTRACT

A display panel and a method for fabricating the same are provided. The display panel includes a substrate, an anode layer, a pixel defining layer, a hole injecting layer, a hole transporting layer, a carbon quantum dot layer, an electron transporting layer, an electron injecting layer, and a cathode. The method for fabricating the display panel includes steps of providing a substrate, fabricating an anode layer, fabricating a pixel defining layer, disposing through hole, fabricating a hole transport layer, fabricating a carbon quantum dot layer, fabricating an electron transport layer, and fabricating a cathode layer.

5 Claims, 2 Drawing Sheets

(51) Int. Cl.
*H01L 51/50* (2006.01)
*H01L 51/56* (2006.01)
(52) U.S. Cl.
CPC ...... *H01L 51/5072* (2013.01); *H01L 51/5092* (2013.01); *H01L 51/56* (2013.01)

(56) References Cited

U.S. PATENT DOCUMENTS

| | | | |
|---|---|---|---|
| 2015/0325803 A1* | 11/2015 | Lee | H01L 51/0096 257/40 |
| 2016/0064681 A1 | 3/2016 | Lee et al. | |
| 2016/0240821 A1* | 8/2016 | Carroll | H01L 51/5296 |
| 2017/0133614 A1 | 5/2017 | Gu et al. | |
| 2017/0261788 A1* | 9/2017 | Cheng | H01L 27/1262 |
| 2017/0269274 A1* | 9/2017 | Cheng | G02B 5/3041 |
| 2018/0090709 A1* | 3/2018 | Meng | H01L 51/5221 |
| 2018/0156954 A1* | 6/2018 | Cheng | G02F 1/017 |
| 2018/0166519 A1* | 6/2018 | Kim | H01L 51/5284 |
| 2018/0366673 A1* | 12/2018 | Xie | H01L 51/56 |

FOREIGN PATENT DOCUMENTS

| | | | |
|---|---|---|---|
| CN | 105098084 A | 11/2015 | |
| CN | 106229387 A | 12/2016 | |
| CN | 106519800 A | 3/2017 | |
| CN | 110085748 A | 8/2019 | |

* cited by examiner

METHOD FOR FABRICATING DISPLAY PANEL HAVING CARBON QUANTUM DOT LAYER

FIELD OF INVENTION

The present invention relates to a display technology, and more particularly to a display panel and a method for fabricating the same.

BACKGROUND

Carbon quantum dot material is a semiconductor material that can be formed by solution processing, having characteristics of easy processing and low cost, so that has been highly valued by researchers in recent years and has excellent performance in light emitting field. At the same time, carbon quantum dot materials have advantages similar with those of quantum dot materials, such as adjustable wavelength, light emitting properties of narrow light-emitting spectrum and having no heavy metal elements, thereby having great potential in the fields like electroluminescence and display.

At present, methods for producing a film comprising sputtering, evaporation, silk screen, spin coating, blade coating, dip coating, lift coating, and inkjet printing, in which sputtering and evaporation are costly, and thickness and precision are not easy controlled by silk screen. Spin coating process has large centrifugal force at the edge portion during large-area film fabrication, and a film is relative thin and uneven overall thickness, which is not suitable for large-area film fabrication, but it has outstanding advantages in small-area device fabrication, because the processing equipment is simple and easy to operate, so that it has a particularly wide range of applications in the laboratory. During dip coating and lift coating in the fabrication process, the back of the glass is also covered by the fabricated film, resulting in the need for secondary cleaning.

In contrast, inkjet printing is suitable for low-cost, continuous, large-area, large-scale industrial production. Compared with other film fabrication methods, inkjet printing has precise thickness and position control of a micron resolution. It can realize all digital graphic output, and can realize the flexible application prospects in large-scale production through the computer's outstanding advantages such as flexible and high-precision control of the processing process, and has received extensive attention and attention.

Carbon quantum dot material is a nano-particle material, which can be fabricated by a developed solution processing equipment. Currently, the most developed processing methods are spin coating and inkjet printing. The carbon quantum dot material can be dispersed in a solvent to form an ink, and the carbon quantum dot material can accurately deposit at a predetermined position according to the required amount by jet printing techniques, thereby depositing and forming a precise pixel film. This facilitates fabrications of carbon quantum dot illumination devices and reduces costs.

Carbon quantum dot material has good light emitting properties under luminescence performance, and the spectrum is narrow and the efficiency is high, and the particle size can be used to adjust the light color. The high light emitting efficiency makes it have a good application prospects under electroluminescence conditions.

SUMMARY

An object of the present invention is to solve the technical problem that the luminance of the light emitting layer in the conventional display panel is not good and the light emitting properties fails to meet high requirements.

In order to achieve the above object, the present invention provides a display panel comprising: a substrate; an anode layer disposed over a surface on a side of the substrate; a pixel defining layer disposed over a surface on a side of the anode layer away from the substrate; a through hole disposed opposite to the anode layer, passing through the pixel defining layer; a hole injection layer disposed over a surface on a side of the anode layer away from the substrate; a hole transport layer disposed in the through hole, extending to the surface of the pixel defining layer; a carbon quantum dot layer disposed over a surface on a side of the hole transport layer away from the pixel defining layer; an electron transport layer disposed over a surface on a side of the carbon quantum dot layer away from the hole transport layer; an electron injection layer disposed over a surface on a side of the electron transport layer away from the carbon quantum dot layer; and a cathode layer disposed over a surface on a side of the electron transport layer away from the carbon quantum dot layer.

In addition, the carbon quantum dot layer comprises carbon quantum dots.

In addition, the carbon quantum dots have a diameter of about 1-20 nm.

In addition, the carbon quantum dot layer has a thickness of about 10-2000 nm.

In order to achieve the above object, the present invention also provides a method for fabricating a display panel, comprising the following steps: a substrate providing step for providing a substrate; an anode layer fabricating step for fabricating an anode layer over an upper surface of the substrate; a pixel defining layer fabricating step for fabricating preparing a pixel defining layer over an upper surface of the anode layer; a through hole disposing step for disposing a through hole in the pixel defining layer, so that the through hole is opposite to the anode layer; a hole injection layer fabricating step for fabricating a hole injection layer in the through hole and on the upper surface of the pixel defining layer; a hole transport layer fabricating step for fabricating a hole transport layer over an upper surface of the hole injection layer; a carbon quantum dot layer fabricating step for fabricating a carbon quantum dot layer over the upper surface of the hole transport layer; an electron transport layer fabricating step for fabricating an electron transport layer over an upper surface of the carbon quantum dot layer; an electron injection layer fabricating step for fabricating an electron injection layer over an upper surface of the electron transport layer; and a cathode layer fabricating step for fabricating a cathode layer over the upper surface of the electron transport layer.

In addition, the carbon quantum dot layer fabricating step comprises a carbon quantum dot solution fabricating step for fabricating a carbon quantum dot solution; and a carbon quantum dot solution printing step for printing the carbon quantum dot solution over the upper surface of the hole transport layer.

In addition, the carbon quantum dot solution fabricating step comprises the following steps: a reaction liquid fabricating step for dispersing a carbon quantum dot material of 0.01-30 wt % in a solvent of 40-99.7 wt % to form the reaction liquid; and a conditioning step for adding a conditioning agent to the reaction solution to form a carbon quantum dot solution while stirring the reaction solution.

In addition, the solvent comprises an organic solvent, and the organic solvent comprises a compound containing at least one alkane or aromatic hydrocarbon; and/or, containing at least one alcohol compound; and/or, a solvent with a boiling point above 200° C.

In addition, the solvent comprises an ether compound, an ester compound, or an aromatic compound having a boiling point higher than 200° C.

In addition, the conditioning agent comprises a first conditioning agent, wherein the first conditioning agent comprises at least one of a cosolvent, a surfactant, a small molecular compound for modulating surface tension; and a second conditioning agent comprising at least one of an alcohol, an ether, an ester, a phenol, and an amine.

The technical performances of the present invention are to use a carbon quantum dot as a material of the light emitting layer to improve the quantum efficiency of the display panel, and to further improve the light emitting efficiency of the display panel. At the same time, the display panel can emit light of different colors without using quantum dots of different colors but by controlling different particle sizes of the carbon quantum dots.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
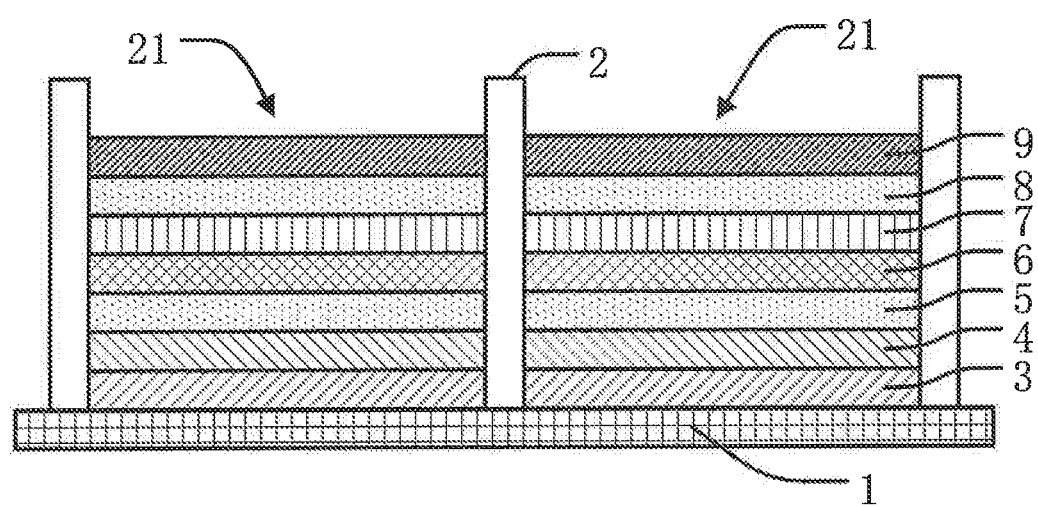
FIG. 1 is a schematic structural diagram of a display panel according to an embodiment of the present invention.

Please refer to the drawings in the drawings, in which the same reference numerals represent the same components. The following description is based on the specific embodiments of the present invention as illustrated and should not be construed as limiting the specific embodiments that are not described herein.

The directional terms mentioned in the present invention, such as "upper", "lower", "before", "after", "left", "right", "inside", "outside", "side", etc., are only used to show direction in the figures. The directional terms used in the drawings are used to explain and explain the invention and are not intended to limit the scope of the invention.

In the drawings, structurally identical components are denoted by the same reference numerals, and structural or functionally similar components are denoted by like reference numerals. Moreover, the size and thickness of each component shown in the drawings are arbitrarily shown for ease of understanding and description, and the invention does not limit the size and thickness of each component.

When a component is described as "on" another component, the component can be placed directly on the other component; there can also be an intermediate component that is placed on the intermediate component, and the intermediate component is placed on another component. When a component is described as "installed to" or "connected to" another component, it can be understood as "directly" or "connected" or a component is "mounted to" or "connected" through an intermediate component to another component.

The embodiment provides a display panel comprising the display panel as shown in FIG. 1. The display panel comprises a substrate 1, a pixel defining layer 2, an anode layer 3, a hole injection layer 4, a hole transport layer 5, and a carbon quantum dot layer 6, an electron transport layer 7, an electron injection layer 8, and a cathode layer 9.

The substrate 1 function as a support and may be a solid substrate or a flexible substrate. The solid substrate comprises glass, and the flexible substrate comprises polyimide.

The anode layer 3 is disposed over the upper surface of the substrate 1, and the anode layer 3 (anode) is electrically connected to a thin film transistor (TFT) of the display panel, and an electrical signal is obtained from the thin film transistor (TFT) to supply an electric signal to the entire display panel, The material of the anode layer 3 (anode) is a material having a high work function, and is generally indium tin oxide (ITO), indium zinc oxide (IZO), gold (Au), platinum (Pt), silicon (Si), or the like. In this embodiment, indium tin oxide (ITO) is preferred. Holes are injected from the anode layer 3 into the hole injection layer 4, and holes migrate to the carbon quantum dot layer 6 through the hole transport layer 5 and meet electrons in the carbon quantum dot layer 6, thereby forming excitons and exciting light emitting molecules, and the light emitting molecules emits visible light through radiation relaxation.

The pixel defining layer 2 is disposed over the upper surface of the anode layer 3 to define a light emitting layer. The pixel defining layer 2 is provided with a through hole 21, and the through hole 21 is disposed opposite to the anode layer 3. The through hole 21 is used to provide a channel for a subsequently formed layer.

The hole injection layer 4 is disposed over the upper surface of the anode layer 3 to inject holes. The material of the hole injection layer 4 is generally a metal oxide doped p-type material, a conductive polymer (PEDOT:PSS), or other materials capable of performing hole injection. The hole injection layer 4 has a thickness of about 1-100 nm.

The hole transport layer 5 (HTL) can realize directionally and orderly controlled migration of holes under an action of an electric field when the carrier (i.e., holes) is injected, thereby achieving the function of transporting charges. The material of the hole transport layer 5 can be a conductive polymer (PEDOT:PSS) or the like, and the hole transport layer 5 has a thickness of about 10-300 nm.

The carbon quantum dot layer 6 is disposed over the upper surface of the hole transport layer 5, and the carbon quantum dot layer 6 is a light emitting layer. Holes and electrons are combined and emitted in the carbon quantum dot layer 6 to realize the light emitting function. The thickness of the carbon quantum dot layer 6 is about 10-2000 nm. The material of the carbon quantum dot layer 6 is carbon quantum dots, and the carbon quantum dots have a particle diameter of about 1-20 nm. In the visible light range, different particle sizes can emit different colors of light. For example, the carbon quantum dot layer 6 emits blue light while the particle diameter of the carbon quantum dot is 2 nm, and the carbon quantum dot layer 6 emits green light while the particle diameter of the carbon quantum dot is 5 nm, and the carbon quantum dot layer 6 emits red light while the particle diameter of the carbon quantum dot is 10 nm. The carbon quantum dots can satisfy the light emitting requirements of the light emitting layer, and there is no need to use different color quantum dots for emitting light.

The use of carbon quantum dot for light emitting makes a light emitting efficiency of the display panel reach 5-25%, which is much higher than the light emitting efficiency of various existing light emitting materials.

The electron transport layer 7 (ETL) is disposed over the upper surface of the carbon quantum dot layer 6 for transporting electrons into the carbon quantum dot layer 6. The electron transport layer 7 can realize directionally and orderly controlled migration of electrons under an action of an electric field when the electron carrier (i.e., electrons) is injected, thereby achieving the function of transporting charges. The material of the electron transport layer 7 is an organic semiconductor material, and the organic semiconductor material has high film stability, thermal stability, and good electron transportability. For example, 1,3,5-tris(1-phenyl-1H-benzimidazol-2-yl) benzene (TPBI)) is generally used, or metal oxides such as zinc oxide (ZnO) can be also used. The thickness of the electron transport layer 7 is about 2-200 nm.

The electron injection layer 8 is disposed over the upper surface of the electron transport layer 7 for injecting electrons. The material of the electron injecting layer 8 generally comprises a simple substance of an alkali metal, a halide, a carbonate or other material which can be used for electron injection. The electron injecting layer 8 has a thickness of about 0.5-100 nm.

The cathode layer 9 is disposed over the upper surface of the electron injecting layer 8. The cathode layer 9 is used to introduce electrons into the electron injecting layer 8. The cathode layer 9 is made of a low work function material, and generally comprises an elemental metal or alloy material. The elemental metal comprises silver (Ag), aluminum (Al), lithium (Li), magnesium (Mg), calcium (Ca), indium (In), etc., and the alloy material comprises magnesium aluminum alloy [Mg:Ag (10):1], lithium aluminum alloy [Li:Al (0.6% Li)]. Electrons are injected from the cathode layer 9 to the electron injection layer 8. Electrons migrate to the carbon quantum dot layer 6 through the electron transport layer 7 and meet holes in the carbon quantum dot layer 6, thereby forming excitons and exciting the light emitting molecules. The light emitting molecules emits visible light by radiation relaxation. The thickness of the cathode layer 9 is about 10-1000 nm.

The technical performances of the display panel of this embodiment are to use a carbon quantum dot as a material of the light emitting layer to improve the quantum efficiency of the display panel, and to further improve the light emitting efficiency of the display panel. At the same time, the display panel can emit light of different colors without using quantum dots of different colors but by controlling different particle sizes of the carbon quantum dots.

Figure 2:
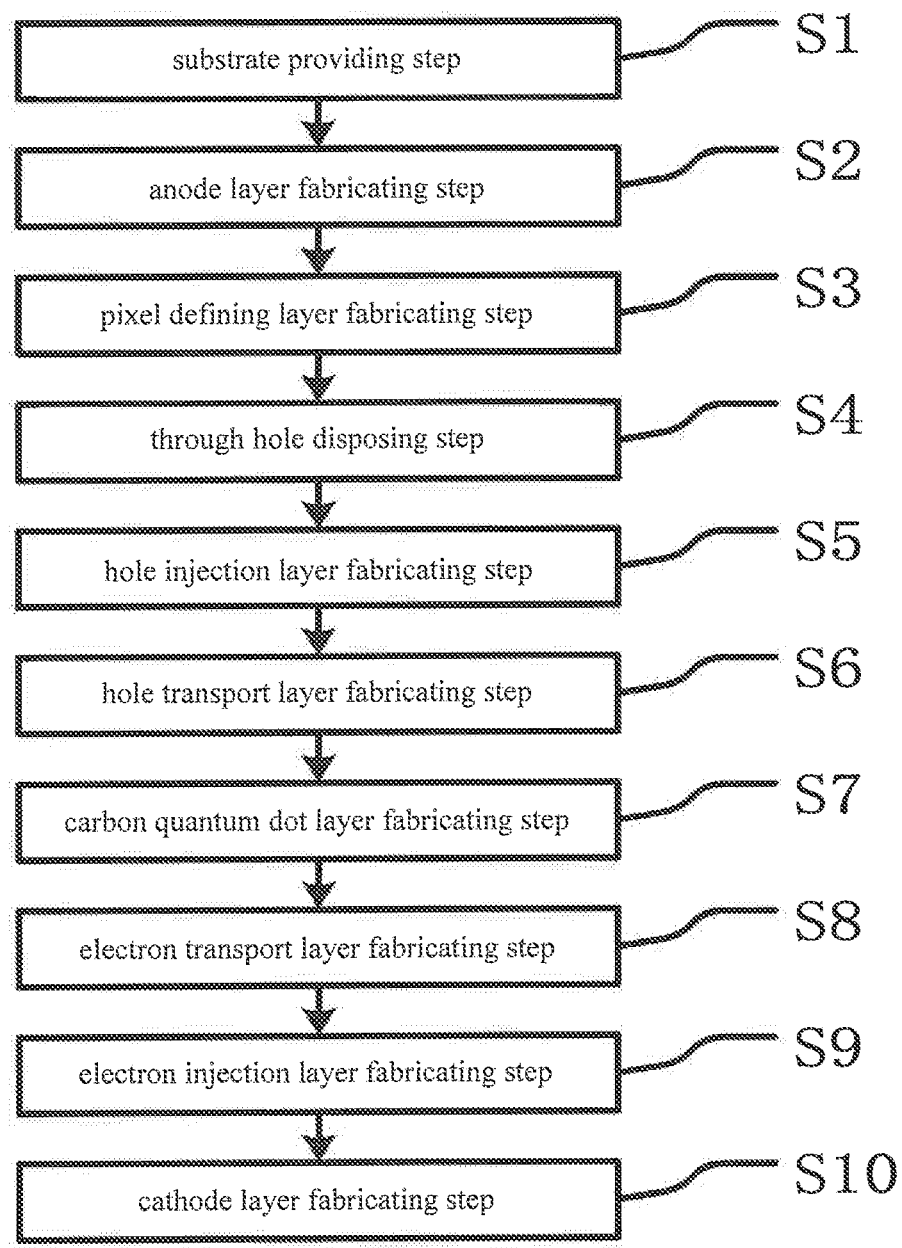
FIG. 2 is a flowchart of a method for fabricating a display panel according to an embodiment of the present invention.

As shown in FIG. 2, the present invention further provides a method for fabricating a display panel, comprising steps S1-S10.

S1—a substrate providing step: a substrate is provided and serves as a support. It may be a solid substrate or a flexible substrate. The solid substrate comprises glass, and the flexible substrate comprises polyimide.

S2—an anode layer fabricating step: an anode layer is fabricated and disposed over the upper surface of the substrate by a magnetron sputtering technique, and the anode layer is made of a material having a high work function which is generally indium tin oxide (ITO), indium zinc oxide (IZO), gold (Au), platinum (Pt), silicon (Si), etc. In this embodiment, indium tin oxide (ITO) is preferred.

S3—a pixel defining layer fabricating step: a pixel defining layer is fabricated and disposed over the upper surface of the anode layer, and the pixel defining layer is used to define a light emitting layer.

S4—a through hole disposing step: a through hole is formed in the pixel defining layer, and the through hole is opposite to the anode layer. The through hole is used to provide a channel for a layer that is sequentially formed.

S5—a hole injection layer fabricating step: a hole injection layer is fabricated and disposed over the upper surface of the anode layer by inkjet printing, spin coating, or vapor deposition, and the hole injection layer is for injecting holes. Raw materials for inkjet printing, spin coating, or evaporation are generally metal oxide doped p-type materials, conductive polymers (PEDOT:PSS), or other materials that can serve as hole injection. The obtained hole injection layer has a thickness of about 1-100 nm.

S6—a hole transport layer fabricating step: a hole transport layer is fabricated and disposed over the upper surface of the hole injection layer by an inkjet printing technique, so that the hole transport layer can realize directionally and orderly controlled migration of holes under an action of an electric field when the carrier (i.e., hole) is injected, thereby achieving the function of transporting charges. The raw materials of the inkjet printing can be a conductive polymer (PEDOT:PSS) or the like, and the obtained hole transport layer has a thickness of about 10-300 nm.

S7—a carbon quantum dot layer fabricating step: a carbon quantum dot solution is printed over the upper surface of the hole transport layer by an inkjet printing technique to fabricate the carbon quantum dot layer. The carbon quantum dot layer has a thickness of about 10-2000 nm. The material of the carbon quantum dot layer is carbon quantum dots, and the carbon quantum dots have a particle diameter of about 1-20 nm. In the visible light range, different particle sizes can emit different colors of light. For example, the carbon quantum dot layer 6 emits blue light while the particle diameter of the carbon quantum dot is 2 nm, and the carbon quantum dot layer 6 emits green light while the particle diameter of the carbon quantum dot is 5 nm, and the carbon quantum dot layer 6 emits red light while the particle diameter of the carbon quantum dot is 10 nm. The carbon quantum dots can satisfy the light emitting requirements of the light emitting layer, and there is no need to use different color quantum dots for emitting light.

Fabricating the carbon quantum dot layer comprises a carbon quantum dot solution fabrication step and a carbon quantum dot solution printing step. The carbon quantum dot solution fabrication step can be prepared in advance. The carbon quantum dot solution fabrication step comprises a reaction liquid preparation step and a conditioning step.

In the reaction liquid preparation step, the carbon quantum dots are dispersed in a solvent to form a reaction liquid, wherein the weight percentage of the carbon quantum dots is 0.01-30 wt %, and the carbon quantum dots uses carbon quantum dot particles having different particle diameters to achieve light emitting colors in different wavelength bands. The solvent is 40-99.7 wt %. The solvent comprises a compound containing at least one alkane or an aromatic hydrocarbon or at least one alcohol compound (may be a monohydric alcohol or polyhydric alcohol). The solvent can be further a high boiling point solvent having a boiling point higher than 200° C., and the high boiling point solvent comprises an ether compound, an ester compound, or an aromatic compound.

In the conditioning step, the reaction liquid is stirred while a conditioning agent is added to the reaction liquid to form a carbon quantum dot solution. The conditioning agent comprises a first conditioning agent and a second conditioning agent. The first conditioning agent is a surface tension adjusting agent, and the surface tension adjusting agent comprises at least one of a cosolvent, a surfactant, and a small molecular compound that adjusts surface tension. The surface tension conditioning agent is 0.01-5 wt %, and the small molecular compound for adjusting the surface tension comprises at least one of imidazole and a derivative thereof, phenol, and hydroquinone. The second conditioning agent is a viscosity conditioning agent, wherein the viscosity conditioning agent is used to adjust the viscosity of the entire solution system. The viscosity conditioning agent is 0.01-5 wt %, and the viscosity conditioning agent comprises at least one of an alcohol, an ether, an ester, a phenol, and an amine.

The inkjet printing technology can accurately deposit the carbon quantum dot material at a set position according to the required amount, thereby depositing a precision pixel film. This is beneficial to the fabrication of the carbon quantum dot light-emitting device and reduces the production cost.

S8—an electron transport layer fabricating step: 1,3,5-tris (1-phenyl-1H-benzimidazol-2-yl) benzene (TPBI) or a metal oxide such as zinc oxide (ZnO) is sprayed over the upper surface of the carbon quantum dot layer by an inkjet printing to fabricating the electron transport layer. The thickness of the electron transport layer is about 2-200 nm.

S9—an electron injection layer fabricating step: an electron injection layer is fabricated over the upper surface of the electron transport layer by inkjet printing, spin coating, or vapor deposition for injecting electrons. The material of the electron injecting layer generally comprises a simple substance of an alkali metal, a halide, a carbonate or another material which can be used for electron injection. The electron injecting layer has a thickness of about 0.5400 nm.

S10—a cathode layer fabricating step: a cathode layer is sputtered over the upper surface of the electron injection layer by a vacuum sputtering technique, and the cathode layer is configured to introduce electrons into the electron injection layer. The cathode layer is made of a low work function material, and generally comprises an elemental metal or alloy material. The elemental metal comprises silver (Ag), aluminum (Al), lithium (Li), magnesium (Mg), calcium (Ca), indium (In), etc., and the alloy material comprises magnesium aluminum alloy [Mg:Ag (10):1)], lithium aluminum alloy [Li:Al (0.6% Li)]. The thickness of the cathode layer is about 10-1000 nm.

The technical performances of the method for fabricating a display panel of this embodiment are to use a carbon quantum dot as a material of the light emitting layer to improve the quantum efficiency of the display panel to about 5-25%, and to further improve the light emitting efficiency of the display panel. At the same time, the display panel can emit light of different colors without using quantum dots of different colors but by controlling different particle sizes of the carbon quantum dots.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for fabricating a display panel, comprising the following steps:
    a substrate providing step for providing a substrate;
    an anode layer fabricating step for fabricating an anode layer over an upper surface of the substrate;
    a pixel defining layer fabricating step for fabricating preparing a pixel defining layer over an upper surface of the anode layer;
    a through hole disposing step for disposing a through hole in the pixel defining layer, so that the through hole is opposite to the anode layer;
    a hole injection layer fabricating step for fabricating a hole injection layer in the through hole and on the upper surface of the pixel defining layer;
    a hole transport layer fabricating step for fabricating a hole transport layer over an upper surface of the hole injection layer;
    a carbon quantum dot layer fabricating step for fabricating a carbon quantum dot layer over the upper surface of the hole transport layer, wherein the carbon quantum dot layer fabricating step comprises:
        a carbon quantum dot solution fabricating step for fabricating a carbon quantum dot solution; and
        a carbon quantum dot solution printing step for printing the carbon quantum dot solution over the upper surface of the hole transport layer;
    an electron transport layer fabricating step for fabricating an electron transport layer over an upper surface of the carbon quantum dot layer;
    an electron injection layer fabricating step for fabricating an electron injection layer over an upper surface of the electron transport layer; and
    a cathode layer fabricating step for fabricating a cathode layer over the upper surface of the electron transport layer.

2. The method of claim 1, wherein the carbon quantum dot solution fabricating step comprises the following steps:
    a reaction liquid fabricating step for dispersing a carbon quantum dot material of 0.01-30 wt % in a solvent of 40-99.7 wt % to form the reaction liquid; and
    a conditioning step for adding a conditioning agent to the reaction solution to form a carbon quantum dot solution while stirring the reaction solution.

3. The method of claim 2, wherein:
    the solvent comprises an organic solvent, and the organic solvent comprises:
        a compound containing at least one alkane or aromatic hydrocarbon; and/or,
        containing at least one alcohol compound; and/or,
        a solvent with a boiling point above 200° C.

4. The method of claim 3, wherein the solvent comprises an ether compound, an ester compound, or an aromatic compound having a boiling point higher than 200° C.

5. The method for manufacturing a display panel of claim 2, wherein the conditioning agent comprises:
    a first conditioning agent, wherein the first conditioning agent comprises at least one of a cosolvent, a surfactant, a small molecular compound for modulating surface tension; and
    a second conditioning agent comprising at least one of an alcohol, an ether, an ester, a phenol, and an amine.

* * * * *